United States Patent
Baleras et al.

(10) Patent No.: US 6,835,577 B2
(45) Date of Patent: Dec. 28, 2004

(54) METHOD FOR MAKING A BLOCK FOR TESTING COMPONENTS

(75) Inventors: François Baleras, Seyssinet (FR); Catherine Brunet-Manquat, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 79 days.

(21) Appl. No.: 10/399,844

(22) PCT Filed: Oct. 23, 2001

(86) PCT No.: PCT/FR01/03287

§ 371 (c)(1),
(2), (4) Date: Apr. 21, 2003

(87) PCT Pub. No.: WO02/35244

PCT Pub. Date: May 2, 2002

(65) Prior Publication Data

US 2004/0070925 A1 Apr. 15, 2004

(30) Foreign Application Priority Data

Oct. 24, 2000 (FR) .............................................. 00 13616

(51) Int. Cl.⁷ .............................................. H01L 21/00
(52) U.S. Cl. .......................................... 438/11; 438/17
(58) Field of Search ...................... 438/17, 11; 324/755

(56) References Cited

U.S. PATENT DOCUMENTS 5,915,977 A * 6/1999 Hembree et al. ............. 439/74
5,951,305 A * 9/1999 Haba ............................ 439/70
6,016,060 A * 1/2000 Akram et al. ................ 324/757
6,091,252 A * 7/2000 Akram et al. ................ 324/755
6,242,932 B1 * 6/2001 Hembree ..................... 324/755
6,263,566 B1 * 7/2001 Hembree et al. ............. 29/874
6,285,203 B1 * 9/2001 Akram et al. ................ 324/755
6,333,555 B1 * 12/2001 Farnworth et al. ........... 257/737
6,400,169 B1 * 6/2002 Hembree ..................... 324/755
6,504,389 B1 * 1/2003 Hembree ..................... 324/755

OTHER PUBLICATIONS

Akram, Salman, "Silicon Contact Technology for Flip Chip", 1999, IEEE Electronic Components and Technology Conference, pp 510–514.

Crowley, Robert, "Socket Developments for CSP and FBGA Package", printed from http://chipscalereview.com/chipscalen2/9805/crowley1.htm on Apr. 13, 2000.

* cited by examiner

Primary Examiner—George Fourson
Assistant Examiner—Fernando L. Toledo
(74) Attorney, Agent, or Firm—Thelen Reid & Priest LLP

(57) ABSTRACT

The invention relates to a test socket (10) for an electronic component, comprising a embossed support layer (12) comprising several embossments (16) with projecting relief, the embossments being provided with at least one conducting test area (14) near the top of the embossment, that may be brought into electrical contact with a terminal of the component.

Application to testing bare or packaged electronic components.

7 Claims, 3 Drawing Sheets

METHOD FOR MAKING A BLOCK FOR TESTING COMPONENTS

CROSS-REFERENCE TO RELATED APPLICATION

This application claims priority based on International Patent Application No. PCT/FR01/03287, entitled "Component Test Socket And Process For Making Such A Socket" by Francois Baleras and Catherine Brunet-Manquat, which claims priority of French Application No. 00/13616, filed on Oct. 24, 2000, and which was not published in English."

TECHNICAL FIELD

This invention relates to an electronic component test socket and a process for making such a socket.

Changes to the integration density of electronic components have been accompanied by an increase in the number of their input and output terminals. Furthermore, the continuously increasing values of the operating frequency of circuits have reduced the size of component interconnections and packages.

A series of tests needs to be carried out on electronic circuits at the time of manufacturing, and particularly after the end of manufacturing, to check that they are working correctly. These tests are made by connecting input and output terminals to test equipment designed to automatically carry out a number of measurements.

Since electronic circuits have to be disconnected from test equipment after they have been tested, test sockets are used that hold the circuits to be tested and facilitate the temporary electrical connection of input and output terminals of electronic circuits with the test equipment.

The invention is used for applications to test all types of circuits, either in the form of unfinished circuits on a semi-conductor wafer, or packaged. In particular, the invention may be used for testing flip-chip type circuits (with balls made of a meltable material), or CSP (Chip Scale Package) or BGA (Ball Grid Array) type circuits.

STATE OF PRIOR ART

Document (1), for which the reference is given at the end of the description, describes a test socket made from a rigid silicon board. The board comprises etched cavities, the walls of which are lined with a metallic layer. The metallic layer is used as a test area and is connected to an outside test equipment.

This type of socket is particularly suitable for testing circuits for which the input and output terminals are lined with balls made of a meltable material. These balls then come directly into contact with the test areas of the socket cavities.

The use of a socket for which the pitch of the cavities is adapted to suit the pitch of the balls made of a meltable material on one face of a component, makes it possible to simultaneously carry out tests on a large number of inputs and outputs. However, this type of socket has a number of limitations.

It is possible that the face of the component on which the input and output terminals are located may have a planeness defect. Furthermore, the diameters of the balls made of a meltable material on the terminals may not be perfectly uniform. Since there is no way of compensating for these inequalities, the contact between some balls and some test areas could be imperfect or uncertain. Therefore, this type of test socket cannot be used for an entire wafer of integrated circuits, or for a large package.

Another disadvantage is related to the complex and expensive use of silicon for making sockets.

Finally, since the balls that are usually spherical, come into contact with the approximately plane surfaces of cavities, the electrical contact is limited to a small area and is not always guaranteed to be optimum.

Document (2), which is also referenced at the end of this description, describes improvements for making contact pads for test sockets. These improvements are designed to enable adaptation of the contact pads to different diameters and heights of the balls made of a meltable material.

Without going into details of the various embodiments mentioned, it is found that the sockets are not entirely free of planeness constraints of the wafers in the circuits to be tested, or at least their manufacturing cost is relatively high. Some contact pads also have limitations related to their large size compared with the pitch of the input and output terminals of the circuits to be tested, or limitations related to the relatively low conductivity of some materials used to make them.

PRESENTATION OF THE INVENTION

One purpose of this invention is to propose a test socket for components that does not have any of the limitations of sockets known according to the state of the art presented above.

In particular, one purpose is to propose a test socket that can be used for components provided with several input-output terminals on one contact face, but for which this face may have a planeness defect.

Another purpose is to propose such a socket that guarantees excellent contact quality with circuit input-output terminals despite a disparity of the values of the diameter of contact balls, if any, fitted on input-output terminals.

Another purpose of the invention is to propose a socket adapted to checking highly integrated electronic circuits with a high density of input-output terminals.

Another purpose of the invention is to propose a simple and economic process for production of such a test socket.

More precisely, in order to achieve these purposes, a test socket is proposed for an electronic component comprising a embossed support layer comprising several embossments with projecting relief, the embossments being provided, near the top of the embossment, with at least one conducting test area that may be brought into electrical contact with a terminal of the component.

The embossments may advantageously be designed so that they can deform independently of each other.

The embossed structure of the support layer, and the fact that the test areas are arranged at the top of the embossments, means that a very large number of test areas can be placed on a small area. It also makes it possible to separate a higher "level" containing test areas from a lower "level" for example reserved for a set of interconnection tracks connecting the test areas to a test circuit.

Preferably, each embossment comprises a single test area and is associated with a single input and output terminal for a circuit type to be tested. The distribution of the embossments and their spacing are dictated by the distribution of the input and output terminals for the type of circuit for which the test socket is to be used. For example, the embossments may be distributed in rows and columns, in a regular network.

According to one particular aspect of the invention, the support layer may be made essentially from a flexible material. A flexible material means a material that is sufficiently flexible and elastic so that it can be deformed as much as necessary to compensate for any planeness defects or inequalities in an electronic circuit, an electronic circuit package to be tested or connection terminals of such a package or circuit. A very slight pressure applied to the component to be tested locally deforms the support layer, guaranteeing good contact between all terminals and the corresponding test areas. In particular, deformation compensates for inequalities in the height and/or diameter of contact balls fitted on component input and/or output terminals.

According to another particular aspect of the invention, the socket may comprise peripheral contact areas connected to the test areas through conducting tracks extending essentially between the embossments. Therefore the conducting tracks are essentially located outside the plane of the test strips, so that this plane is available to enable greater integration of the test areas.

At the top of the embossments, the test areas may be plane or they may form a depression or they may be covered by upstands in the form of contact balls, for example made of a meltable material. The shape of the test areas is adapted to the shape or the type of coating on the input and output terminals of the circuits to be tested. When these terminals are already equipped with balls made of a meltable material, the test areas may be plane or they may form a depression with a shape complementary to the shape of the balls.

The flexible support layer may either be self-supporting or it may be added onto a rigid support. This support may accessorily comprise a test circuit for testing components.

The face of the support layer opposite the face equipped with test areas has a reentrant relief complementary to the projecting embossments. The recesses in this relief may possibly be filled in by an elastic material such as an elastomer.

The invention relates to a process for making the socket. This process comprises the following steps:
a) the function in a substrate of cavities forming relief with a shape corresponding to or complementary to an embossment of a support layer to be formed,
b) making a support layer consisting of a layer of flexible material on the substrate, so as to apply embossments corresponding to the relief of the substrate onto the layer, and separation of the support layer from the substrate,
c) the formation of test areas near the top of the embossments, by forming a metal layer.

Step a) to form cavities may be done either by etching or micromachining of a single or multi-layer substrate, or by electroforming of appropriate patterns.

Step b) to make the support layer may be done either by moulding, or by layer spreading.

The steps in the process may be done in the order described above. In this case, step c) includes the deposition of a metallic layer on the support layer, then etching of this layer by means of a mask fixing the size and location of the test areas.

Step c) may also be done before the support layer is separated from the substrate.

According to one variant, step c) may also be done before step b). In this case, a metal is deposited on the substrate used as a mould and is then etched before the support layer is formed.

The metallic layer may be of the single layer or multi-layer type.

A small size projecting relief can be formed on the substrate making up the mould, corresponding to the depressions at the top of the embossments. For example, small upstands may be formed at the bottom of the substrate cavities before step b). These upstands then define the depressions at the top of the embossments in the support layer when it is being moulded.

Other characteristics and advantages of the invention will become clear after reading the following description with reference to the figures in the attached drawings. This description is given purely for illustrative purposes and is in no way limitative.

DETAILED DESCRIPTION OF EMBODIMENTS OF THE INVENTION

In the following description, identical, similar or equivalent parts in the different figures are identified with the same references. However, the various parts are not all shown at the same scale, for reasons of clarity in the figures.

Figure 1:
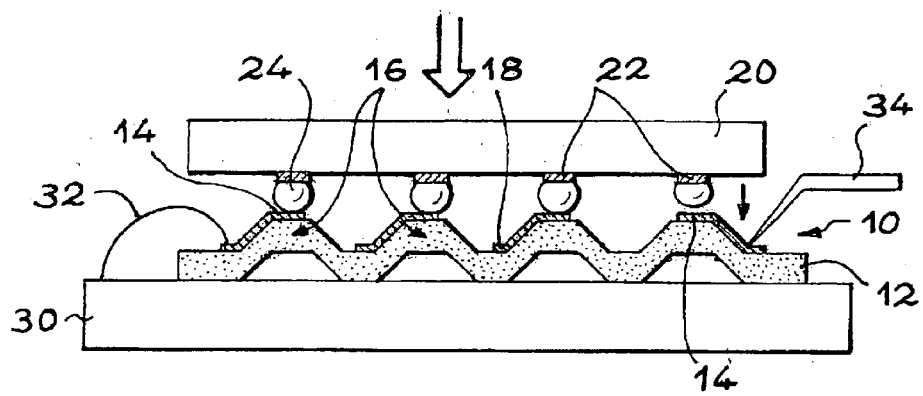
FIG. 1 is a diagrammatic simplified view of a test socket according to the invention, on which an electronic circuit to be tested is applied.

FIG. 1 shows a test socket 10 comprising a support layer 12 on which test areas 14 are formed.

Although we refer to a single support layer, it should be noted that the support layer may be a multi-layer structure, or at least it may be composed of several sub-layers.

The support layer is provided with several embossments 16 at the top of which there are the corresponding test areas 14. These test areas are made of a material conducting electricity, preferably metal, and are extended by a conducting track 18. This conducting track extends between projecting embossments, at a distance from the part near their top.

The spatial distribution of the embossments, and their spacings, are dictated by the distribution and spacing of input-output terminals of a type of circuit with which the socket is to be used. Once again, it should be noted that only a very small number of embossments are shown in the figures, for obvious reasons of clarity. The sockets according to the invention may be provided with a large number of embossments, to match the number of input and output terminals on the components to be tested.

In FIG. 1, an electronic circuit to be tested is marked with the numeric reference 20. It is provided with input-output terminals 22 coated with contact balls 24 made of a meltable material. When the circuit is placed on the socket 10, each contact ball 24 comes into position on a test area 14 of a corresponding embossment.

If there is a planeness defect in the component 20, or if the diameter of the contact balls 24 is not uniform, it is possible that one or several of the contact balls will not touch the test area 14 associated with them. This situation is shown for the contact ball at the rightmost end in FIG. 1.

The material(s) used to make the support layer have a certain flexibility or elasticity. Thus, by applying a slight pressure tending to move the component to be tested towards the socket, the balls already in contact with the test areas will slightly compress the embossments so that the lowest balls can also come into contact with the test areas associated with them. In this respect, note that the size and particularly the height of the relief of the embossment determines the maximum value of the inequalities that can be compensated. For example, the height of the relief of the embossments is preferably chosen to be equal to at least 10% of the total height of the balls, to be able to compensate for a difference in the height of the balls of +/−5% of the average height.

Reference 30 denotes a test circuit designed to send pulses or stimulation signals to the component to be tested and to input the response of the component to these signals, for example to compare them with a set value. The test circuit 30 may be connected to conducting tracks 18 through wire bonding connections 32. According to another possibility, a test circuit (not shown) may be temporarily connected to the conducting tracks 18 through test pins 34.

Figure 2:
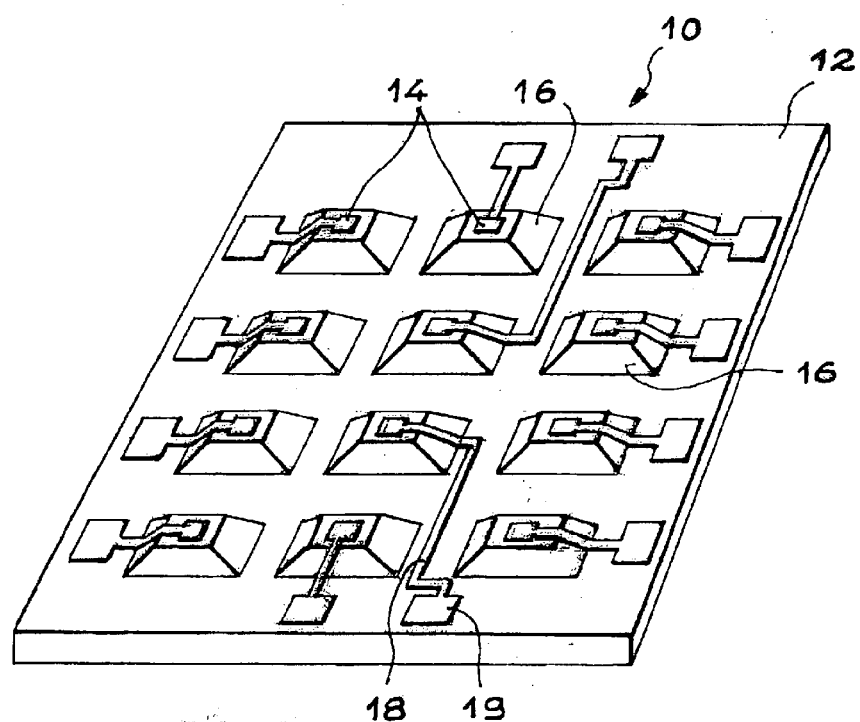
FIG. 2 is a perspective view of another socket according to the invention.

FIG. 2 shows a perspective view of another test socket.

This figure shows that the embossments 16 are in the form of a truncated pyramid, and are provided with test areas 14 near their top.

The conducting tracks 18 connected to the test areas are placed on the bottom of the support layer 12, between the embossments, to join the contact areas 19. These contact areas are formed around the periphery of the support layer 12. The contact areas 19 are designed to facilitate the application of test pins or to facilitate a connection towards a test circuit as described above.

The shape of the embossments may be variable and adapted to the distribution of input and output terminals of the electronic circuits to be tested. For example, the pyramid-shaped embossments may be replaced by truncated embossments pyramid. However preferably, the sides of the embossments are designed to have a slope without an acute angle. The advantage of this characteristic will become clear after reading the remaining part of the description that describes a process for making the socket and in particular a manufacturing process by "moulding".

Figure 3:
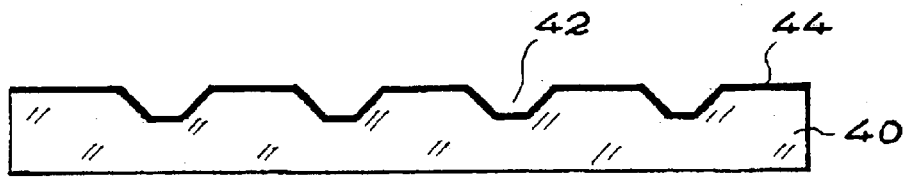
FIGS. 3 to 8 are diagrammatic sections of elements illustrating a process for making a test socket according to the invention.

FIG. 3 shows a step in the preparation of a "mould". This step includes etching of a substrate 40, for example crystalline silicon. Micro-machining of silicon is suitable for obtaining relief with excellent fineness. Dry or wet etching is a conventional type of etching known in photolithography, and uses an etching mask (not shown). The mask defines the shape and position of the elements of the relief to be obtained.

Advantageously, a solution of KOH (Potassium hydroxide) or TMAH (Tetramethyl Ammonium Hydroxide) may be used as the etching agent. This type of solution can take advantage of crystalline planes of silicon to form depressions 42 in the substrate 40 with inclined sides. For example, the pitch of the depressions 42 may be of the order of 50 μm and their depth may be of the order of 20 μm.

After etching, the substrate 40 is covered by a titanium layer 44 that will facilitate subsequent separation of the support layer that will be formed on it.

Figure 4:
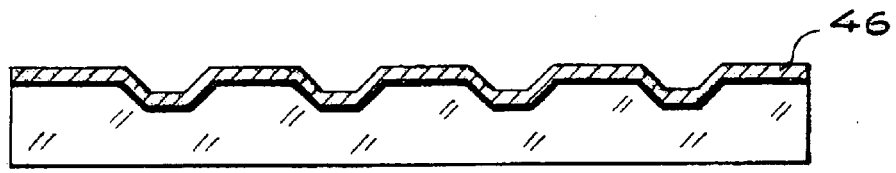
Figure 5:
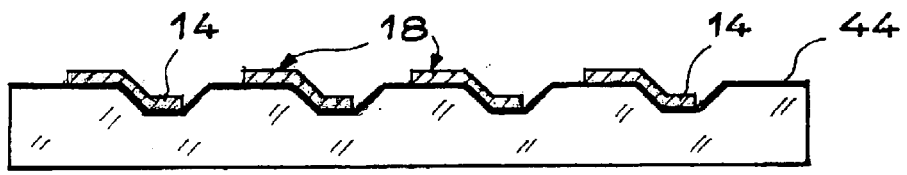

FIG. 4 shows the deposition of a metal layer 46 that entirely covers the face of the substrate with the depressions 42. For example, it may be an approximately 1 μm thick copper layer. The metal layer is subsequently etched using an etching pattern also fixed by a mask (not shown). Etching, as shown in FIG. 5, is a means of forming the future test areas 14 and the future connection tracks 18 or even the contact areas.

When the density of the test areas has to be very high, the copper layer may be replaced by a multi-layer structure including polymer organic dielectric layers and metallic layers.

Figure 6:
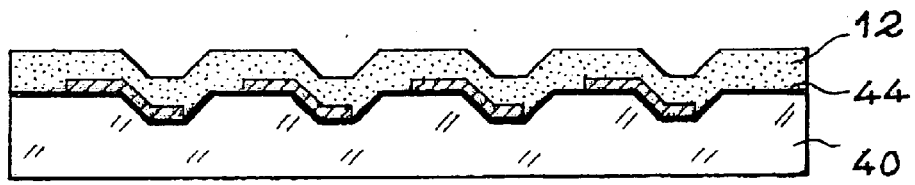

FIG. 6 shows the formation of the flexible support layer 12. In the example described, this step comprises a conform deposition of a layer of a polymerisable material followed by polymerisation of this layer, for example by baking. The deposition of the layer of polymerisable material may take place by spraying or by centrifuging to obtain a layer that perfectly matches the shape of the cavities 42 and the test areas 14. For example, the layer 12 may be made of a polyimide type polymer material, and it may be of the order of 10 μm thick.

Figure 7:
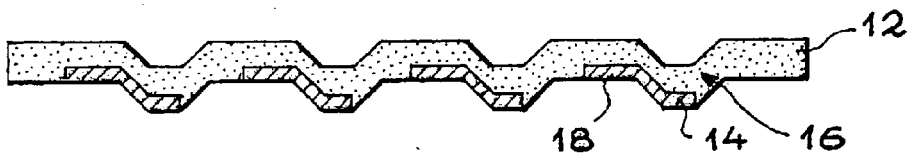

FIG. 7 shows a step consisting of detaching the support layer 12 with its test areas 14, conducting tracks 18 and contact areas, from the substrate. One possible way of implementing this step consist of dipping the substrate into a hydrofluoric acid solution to eliminate the layer of titanium while keeping the copper in the test areas of the tracks and contact areas and the silicon mould.

Figure 8:
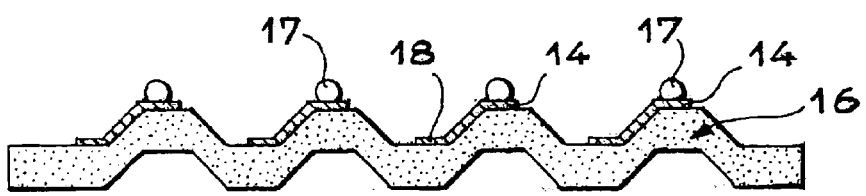

FIG. 8 shows an additional optional step consisting of coating test areas of the contact balls 17 with a meltable material. The formation of these balls, although well known in itself in flip-chip techniques described at the beginning of the text, consists essentially of depositing pads of meltable material on test areas and shaping them by heating the meltable material. Surface tension forces generated in the molten material apply an approximately spherical shape to the material that is fixed when the material cools and solidifies.

A meltable material means any material that can be shaped in this manner and which has a sufficiently low melting point so that it does not modify other parts of the structure. For example, it may be a solder or a lead-tin alloy.

Meltable material balls 17 that are formed on test areas may also be replaced by conducting polymer domes. The test socket thus provided with this type of conducting projections on the test areas is particularly useful for testing components for which there are no contact balls on the input and output terminals.

FIGS. 9 to 12, described below, illustrate a variant of the process in which the order of the steps is modified.

Figure 9:
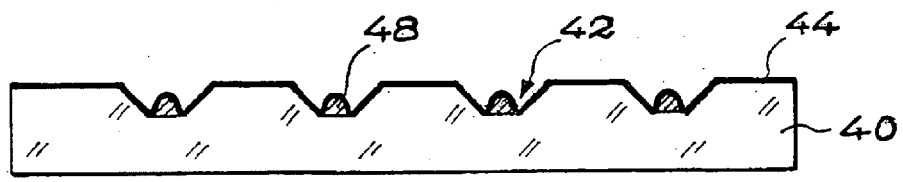
FIGS. 9 to 12 are diagrammatic sections of elements illustrating one variant of the process for making a test socket according to the invention.

A substrate 40 like that described with reference to FIG. 3, is also used for shaping the test socket. FIG. 9 shows a preliminary step consisting of forming small approximately spherical shaped upstands 48 at the bottom of the cavities 42. These upstands are formed using a technique similar to the technique used to form the contact balls. Small metallic upstands 48 made of a meltable material are deposited at the bottom of the cavities 42. For example, they may be composed of a tin-lead alloy, for example deposited by silk screen printing. A remelting heat treatment as described above is then applied to the upstands 48 so that their surface becomes approximately spherical. Finally a sacrificial layer of titanium 44, designed for subsequent separation, is formed on the substrate 40.

Figure 10:
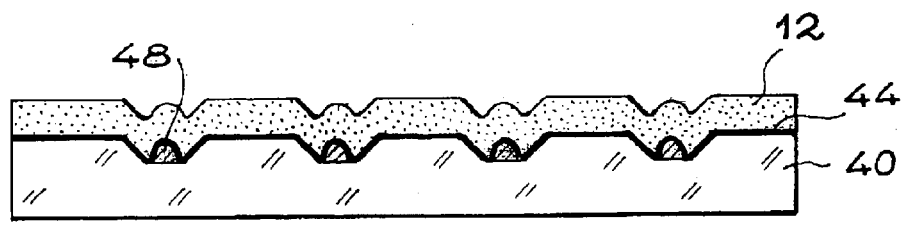

FIG. 10 shows moulding of the support layer 12 and polymerisation of this layer. The support layer 12 matches the shape of the cavities and also the shape of the small metallic upstands 48. These upstands will help to form small depressions at the top of the embossments 16 during the rest of the process.

Figure 11:
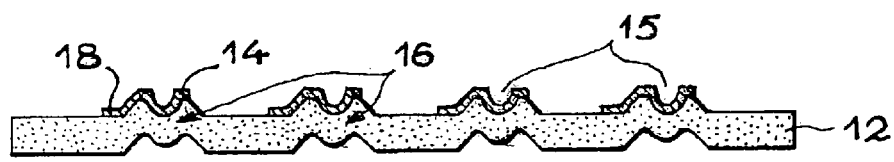

FIG. 11 shows the formation of the test areas 14 and conducting tracks 18 on the support layer, after it has been separated from the substrate 40. The test areas and the conducting tracks are formed by metallisation of the face of the support layer that was in contact with the substrate 40, and then by etching a metal using a photolithography technique. (The contact areas are advantageously made at the same time). It can be seen that the test areas 14 have depressions 15 at their top. These depressions, the diameter of which must depend on the diameter of the upstands formed in the cavities of the substrate 40, may be adapted to the diameter of the contact balls formed on the input and output terminals of the electronic circuits to be tested. For example, for contact balls with a diameter of 200 μm, cavities (hemispherical depression) with a diameter of the order of 110% of this value, namely 220 μm may be made.

Figure 12:
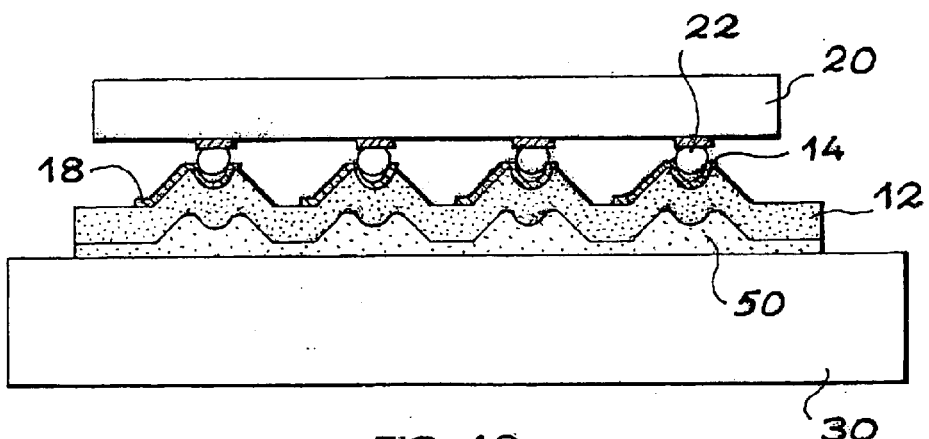

FIG. 12 shows a final step in which the flexible support layer 12, with test areas 14 and conducting tracks 18, is transferred-onto a rigid support 30. This support may be passive or it may possibly comprise a test circuit like that described with reference to FIG. 1. The reentrant relief of the support layer 12 on its face opposite the test areas is filled in by an elastomer layer 50. The elastomer layer that is also used to fix the flexible support layer on the rigid support, may be replaced by a silicone glue or any other material sufficiently flexible so that it does not prevent compensation of height differences of the input-output terminals of the components and the balls in these components.

Reference Documents (1) "Silicon Contact Technology for Flip Chip" by Salman Akram, Electronic Components and Technology Conference, 1999 IEEE, pages 511 to 514.

(2) "Socket Developments for CSP and FBGA Package" by Robert Crowley, Chip Scale review, May 1998, eMail Editor.

What is claimed is:

1. Method for the manufacture of a test socket with an embossed support layer (12) comprising several embossments (16) with projecting relief, the embossments being provided with at least one conducting test area (14) near the top of the embossment, that may be brought into electrical contact with a terminal of the component, the method comprising the following steps:
   a) the formation of cavities (42) in a substrate (42) forming relief with a shape corresponding to or complementary to an embossment of a support layer,
   b) shaping the support layer on the substrate, so as to form embossments (16) in the layer corresponding to the cavities, and separation of the support layer (12) from the substrate,
   c) the formation of test areas (14) by forming a metal layer.

2. Method according to claim 1, in which steps a), b) and c) are implemented in the indicated order, step c) including the deposition of a metallic layer on the support layer (12), then etching of this layer by means of a mask fixing the size and location of the test areas (14).

3. Method according to claim 1, in which step c) is done before step b), the test areas (14) being formed by deposition of metal on the substrate, then by etching the metal by means of a mask fixing the size and location of the said test areas.

4. Method according to claim 1, in which step b) comprises deposition of a layer of a polymerisable material on the substrate, followed by polymerisation of the said material to form the support layer (12).

5. Method according to claim 1, comprising the formation of small upstands (48) at the bottom of the cavities (42) in the substrate (40), before step b), these upstands (48) defining the depressions (15) at the top of the embossments (16) in the support layer (12) when it is being moulded.

6. Method according to claim 1, in which the formation of small upstands (48) at the bottom of cavities (42) includes the deposition of a meltable material at the bottom of the cavities and then a heat treatment at a sufficiently high temperature to enable shaping of the material by remelting.

7. Method according to claim 1, also comprising placement of the support layer (12) on a rigid support (30).

* * * * *